United States Patent
Duensing et al.

(10) Patent No.: US 11,519,982 B2
(45) Date of Patent: Dec. 6, 2022

(54) ADJUSTING OF RADIOFREQUENCY ARRAY USING A CAMERA SYSTEM

(71) Applicant: KONINKLIJKE PHILIPS N.V., Eindhoven (NL)

(72) Inventors: George Randall Duensing, Hamburg (DE); Sascha Krueger, Hamburg (DE); Christian Findeklee, Norderstedt (DE); Oliver Lips, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 17/312,967

(22) PCT Filed: Dec. 9, 2019

(86) PCT No.: PCT/EP2019/084112
§ 371 (c)(1),
(2) Date: Jun. 11, 2021

(87) PCT Pub. No.: WO2020/120347
PCT Pub. Date: Jun. 18, 2020

(65) Prior Publication Data
US 2022/0050156 A1 Feb. 17, 2022

Related U.S. Application Data

(60) Provisional application No. 62/779,502, filed on Dec. 14, 2018.

(30) Foreign Application Priority Data

Dec. 24, 2018 (EP) ..................................... 18215865

(51) Int. Cl.
*G01R 33/3415* (2006.01)
*G01R 33/28* (2006.01)
*G01R 33/36* (2006.01)

(52) U.S. Cl.
CPC ....... *G01R 33/3415* (2013.01); *G01R 33/283* (2013.01); *G01R 33/3628* (2013.01)

(58) Field of Classification Search
CPC .............. G01R 33/283; G01R 33/3628; G01R 33/3415
See application file for complete search history.

(56) References Cited

U.S. PATENT DOCUMENTS

2006/0244449 A1* 11/2006 Muftuler ............ G01R 33/3415
29/601
2008/0001602 A1 1/2008 Schiano et al.
(Continued)

FOREIGN PATENT DOCUMENTS

JP 2018137722 8/2018

OTHER PUBLICATIONS

C. Findeklee, "Array Noise Matching—Generalization, Proof and Analogy to Power Matching," in IEEE Transactions on Antennas and Propagation, vol. 59, No. 2, pp. 452-459, Feb. 2011, doi: 10.1109/TAP.2010.2096183.
(Continued)

*Primary Examiner* — Gregory H Curran

(57) ABSTRACT

A radio frequency (RF) system comprises an RF-array of antenna elements, a regulating arrangement to tune the antenna elements' impedances and a camera system to acquire image information of the RF-array. An analysis module is provided to derive operational settings such as resonant tuning settings, decoupling and impedance matchings of the antenna elements' impedances from the image information. The image information also represents the actual impedances and resonant properties of the RF-array. From the image information appropriate impedance settings can be derived that are the tuning parameters to render the RF-array resonant.

10 Claims, 2 Drawing Sheets

(56) References Cited

U.S. PATENT DOCUMENTS

| | | | |
|---|---|---|---|
| 2015/0150511 A1* | 6/2015 | Van Helvoort | G01R 33/3852 |
| | | | 600/421 |
| 2016/0135711 A1* | 5/2016 | Dohata | G01R 33/34084 |
| | | | 600/422 |
| 2016/0338614 A1 | 11/2016 | Gall et al. | |
| 2017/0371012 A1 | 12/2017 | Leussler | |
| 2018/0017643 A1 | 1/2018 | Zink | |
| 2019/0004127 A1 | 1/2019 | Biber et al. | |

OTHER PUBLICATIONS

Search Report and Written Opinion from PCT/EP2019/084112 dated Jun. 18, 2020.

* cited by examiner

ADJUSTING OF RADIOFREQUENCY ARRAY USING A CAMERA SYSTEM

CROSS REFERENCE TO RELATED APPLICATIONS

This application is a U.S. national phase application of International Application No. PCT/EP2019/084112 filed on Dec. 9, 2019, which claims the benefit of U.S. Provisional Application Ser. No. 62/779,502 filed Dec. 14, 2018 and EP Application Serial No. 18215865.9 filed Dec. 24, 2018 and are incorporated herein by reference.

FIELD OF THE INVENTION

The invention pertains to a radiofrequency (RF) system with an RF-array of antenna elements. The RF-system operates to transmit and/or receive radiofrequency signals. The RF-system may be employed in a magnetic resonance examination system to transmit RF pulses, such as excitation pulses, refocusing pulses or inversion pulses, and to receive magnetic resonance signals that may be in response to the transmitted RF pulses. The RF-array includes a plurality of antenna elements that serve to emit RF fields and/or to pick-up flux of the magnetic resonance signals. Antenna elements may be specially designed for either transmission of RF fields or to receive RF signals. Antenna elements may also be operated alternatively in a transmit and receive mode. In order to efficiently function to transmit RF fields or receive magnetic resonance signals in the MR resonance (Larmor) frequency band, the RF-array needs to be tuned to resonance. This tuning is carried-out by adjusting local impedances of individual antenna elements. One way of adjusting may be to adjust capacitances or inductances in the individual antenna elements.

BACKGROUND OF THE INVENTION

A radio frequency (RF) system with an RF-array of antenna elements is known from the US-patent application US2017/0371012 which shows a multi-channel radio frequency (RF) receive/transmit system for use in a magnetic resonance examination system. The multi-channel RF transmit/receive system comprises a tuning/matching circuit for adjusting tuning and impedance matching settings of the RF coil elements on the basis of a comparison of the forward power and the reflected power.

SUMMARY OF THE INVENTION

An object of the invention is to provide an RF-system with an RF-array of antenna elements of which it is simpler to adjust operational electromagnetic settings.

This object is achieved by the RF-system of the invention which comprises:
an RF-array of antenna elements,
a regulating arrangement to tune the antenna elements' impedances,
a camera system to acquire image information of the RF-array and
an analysis module to derive operational settings of the antenna elements' impedances from the image information.

The camera system acquires image information of the RF-array that represent the way individual antenna elements are located and orientated relative to each other. Because the local impedances of the individual antenna elements are pre-determined, the image information also represents the actual impedances and resonant properties of the RF-array. Accordingly, from the image information appropriate operational electromagnetic settings can be derived. These operational electromagnetic settings may include resonant tuning, decoupling or impedance matching settings of the antenna elements. Impedance settings may be derived that are the tuning parameters to render the RF-array resonant (in its transmit mode or in its receive mode). Hence, the invention achieves to tune the RF-array to resonance, even if the RF-array may be deformed. This tuning is comparatively simpler since it does not need user interaction to adjust individual impedances of the antenna elements. The invention is especially advantageous for resonant tuning of a flexible RF-array. Such a flexible RF-array may be embodied as a 'blanket' that can be comfortably wrapped over or around the body of a patient to be examined. The resonant tuning may be strongly dependent on exactly how the flexible RF-array is placed over or around (a part of) the body of the patient to be examined. Accurate adjustment of the resonant tuning when the flexible RF array is positioned over or around the body of the patient to be examined without the need for (extensive) user interaction adds to a more efficient workflow of the examination protocol in magnetic resonance imaging. Also, impedance matching and (de)coupling may be done accurately taking into account of the geometric deformations of the flexible RF-array.

The invention may be implemented in an RF-array of receiver antenna elements as well as in an RF-array of transmit antenna elements. For either transmit antenna elements or for receiver antenna elements the respective operational settings, such as resonant tuning settings, impedance matchings and (de)couplings may be derived from the image information. Notably, the RF-array may have one set of physical antenna elements that may be driven in receive-mode and in transmit-mode, respectively. For both the receive-mode and for the transmit mode the appropriate operational settings may be derived from the image information.

In brief, a radio frequency (RF) system comprises an RF-array of antenna elements, a regulating arrangement to tune the antenna elements' impedances and a camera system to acquire image information of the RF-array. An analysis module is provided to derive operational settings such as resonant tuning settings, decoupling and impedance matchings of the antenna elements' impedances from the image information. The image information also represents the actual impedances and resonant properties of the RF-array. From the image information appropriate impedance settings can be derived that are the tuning parameters to render the RF-array resonant.

These and other aspects of the invention will be further elaborated with reference to the embodiments defined in the dependent Claims.

In an example of the RF-system of the invention, the analysis module is configured to compute the RF-array's actual geometrical shape from the image information and derive the operational settings, including resonant tuning settings of the antenna elements' impedances in dependence of the computed RF-array's actual geometrical shape. The actual geometrical shape of the RF-array relates directly to the resonant tuning settings of the impedances of the antenna elements for that geometrical shape. Thus, the appropriate impedance settings may be rapidly and accurately derived from the actual geometric shape. Further, the actual geometric shape can be computed or recognised from the image information without much computational effort. Other operational settings such as decoupling and impedance matching settings can be derived from the computed RF-array's actual geometrical shape. The decoupling settings may relate to (de)coupling between individual antenna elements as well as to decoupling between signal channels that convey power to or data from respective groups of antenna elements (often referred to as 'pre-amp decoupling').

In another example, of the RF-system of the invention, the analysis module includes a trained neural network that is trained to derive the resonant tuning settings from the image information or from the computed RF-array's actual geometrical shape. The trained network may be trained to derive decoupling and impedance matching settings from the computed RF-array's actual geometrical shape. The operation of the neural network does not need much (or even any) user interaction. Such a trained neural network, or machine learning module, returns the accurate appropriate operational settings such as resonant impedance settings, decoupling and impedance matching settings with little latency.

In another example of the RF system of the invention, the analysis module is configured to receive information on mutual electromagnetic coupling between antenna elements and on electromagnetic coupling between the antenna elements and a load. The trained neural network is trained to derive additional decoupling settings of the RF-array to compensate for mutual electromagnetic coupling and/or electromagnetic coupling to a load. In one implementation the analysis module may be configured to derive mutual coupling between antenna elements and coupling of the antenna elements to a load, e.g. a patient to be examined, form the image information. For example mutual distances between antenna elements and between respective antenna elements and the load may be derived from the image information. From these distances and the electromagnetic properties and the electromagnetic susceptibility and dielectric aspects of the load, the couplings among antenna elements and of antenna elements to the load may be computed. The additional decoupling settings may be related to adjustment of transformers and shared capacitors that are provided between individual antenna elements to adjust the mutual (de)coupling. Ways to achieve decoupling of individual antenna elements in the RF-array are known per se from the ISMRM-2007 abstract 'Decoupling of a multi-channel transmit/receive coil array via impedance inversion' (p. 1020). Information on the mutual coupling and coupling to the load may also be acquired from sensors provided to sense local impendences. Compensation of mutual coupling and coupling to the load may be done by means of so-called 'Array Noise Matching' which mainly means not tuning the elements exactly to resonance but in a controlled way such that the combined resonance of coupled elements is controlled.

In another example of the RF-system of the invention, the camera system includes a depth sensing camera assembly. In this example the camera system's output data represent volumetric aspects of the RF-array. Notably local three-dimensional relative orientations and positions of antenna element in the RF-array relative to each other influence the mutual impedances. The volumetric image information includes such three-dimensional relationships. Hence, deriving the operational electromagnetic settings, including resonant tuning settings from such volumetric image information accounts of the three-dimensional relationships between the antenna elements. From the image information also adjustment of mutual couplings may be derived. The mutual couplings may be formed by local transformers, capacitances or inductances that are circuited between two or more antenna elements. Adjusting these transformers, capacitances and inductances cause to adjust these mutual couplings. Further, decoupling settings and impedance matching settings may be derived from the image information.

Further, from the image information, also geometrical relationships may be derived between the RF-array and the load, such as orientations and distances between the RF-array and the load may be derived. From these geometrical relationships between the RF-array and the load, the mutual electromagnetic coupling between the RF-array and the load may be computed. This computed electromagnetic coupling may be accounted for when adjusting operational settings such as the resonant tuning, impedance matchings and (de)couplings of the RF-array.

In another example of the RF-system of the invention, a contrast enhancement pattern is disposed on the RF-array. Because of this contrast enhancement pattern it is easier to extract the al shape of the RF-array from the image information. To derive geometrical shape may be more reliable because the geometrical shape is easier to recognise.

Very good results are achieved when the invention is implemented in an RF-system with a flexible RF-array. Such a flexible RF-array may be shaped like a blanket that can be wrapped around or snugly draped over the body of the patient to be examined. On the one hand, the flexible array may be accurately shaped to have close distances over its array to ben patient's body, on the other hand, there is a wide range of shapes that the RF-array can attain. The RF-system of the invention is able the account for these very many actual shapes of the RF-array to set the operational electromagnetic settings, such as the resonant tuning settings. When the flexible array is arranged closely to the patient's body over the area of the flexible array, the magnetic resonance signals are acquired at a good signal-to-noise ratio.

In another example of the RF-system of the invention, the analysis module is provided with a pattern recognition function to recognise sharp shape transitions (wrinkles, cusps, . . . ) in the RF-array's actual shape. It is found that the impedances between the antenna elements may be singularly depending on that shape at sharp transitions such as cusp wrinkles etc. In such situation the derived geometrical shaped may be inherently smooth in the computation, and the exact sharp transition not adequately obtained. A warning to the operator may inform the operator that the resonant settings may not be relied upon. Further, the analysis module may upon detection of a cusp or a wrinkle, etc., prompt the operator to re-arrange the (flexible) RF-array over the patient's body.

The invention also pertains to a method of training a neural network to associate the operational electromagnetic settings, including the resonant tuning settings of the antenna elements. The training involves to shape the flexible RF array into one geometrical shape. For this geometrical shape the RF array's scattering matrix is measured. The resonant tuning settings for the individual antenna elements are obtained by adjusting the resonant tuning settings such that the reflection of RF signals applied to the RF-array becomes minimal. This procedure is iterated for a plurality of geometrical shapes of the RF-array. In this manner, the neural network is trained to recognise the resonant tuning settings from the observed actual geometrical shape of the RF array. The training's efficiency may be improved by defining a relatively small number of plausible deformations that appear to have a likelihood to occur in clinical practice. In this manner the neural network may be trained to recognise the resonant tuning settings from a relative small training set of pre-selected plausible deformations. Also, operational settings like impedance matching and decoupling settings may be recognised from the actual geometric shape and includes in the library On the basis of this library the neural network is trained to recognise the proper operational settings such as resonant tuning setting, impedance matching setting and/or (de)couplings for arbitrary actual geometrical shapes of the RF-array.

These and other aspects of the invention will be elucidated with reference to the embodiments described hereinafter and with reference to the accompanying drawing wherein

DETAILED DESCRIPTION OF THE EMBODIMENTS

Figure 1:
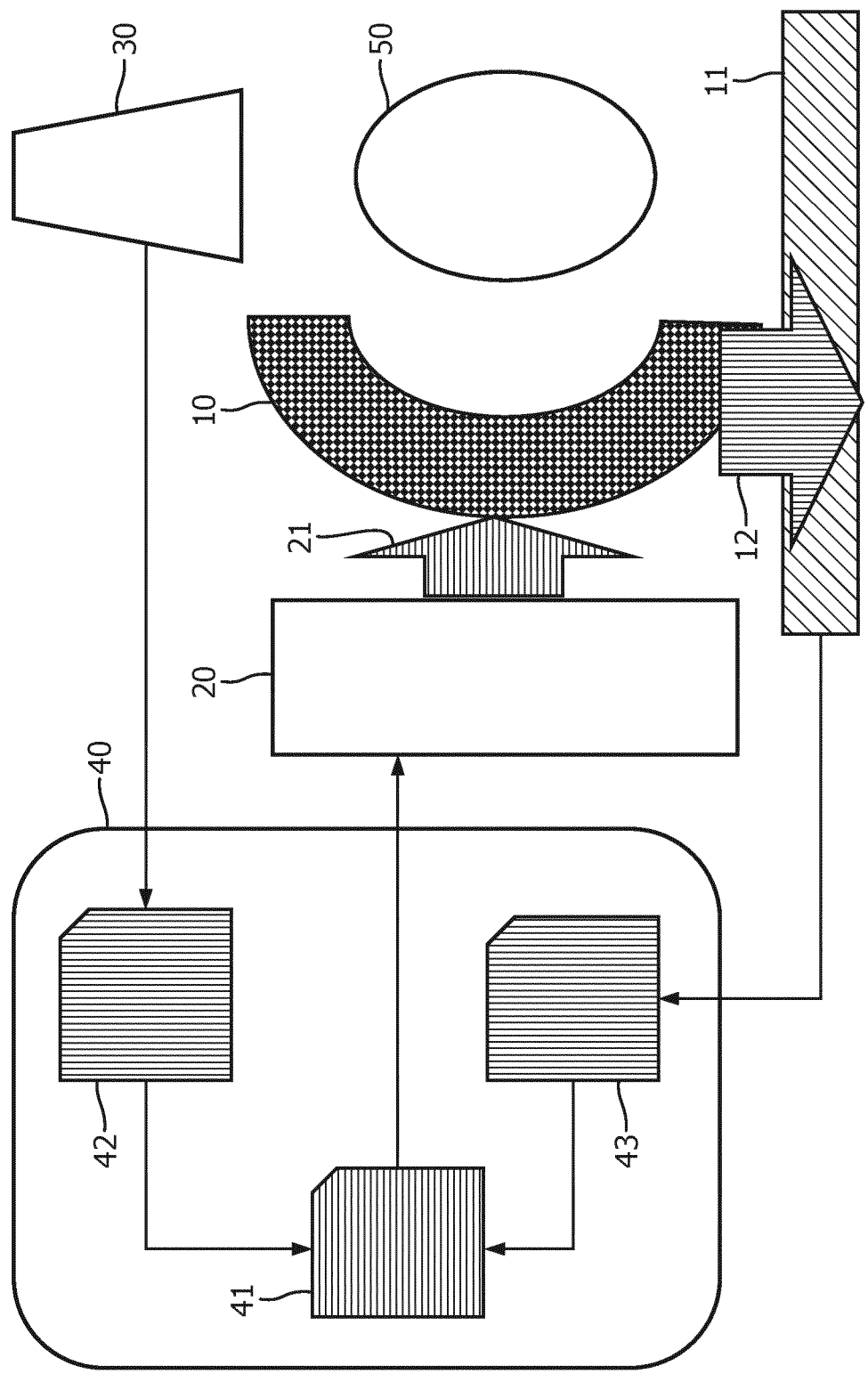
FIG. 1 shows a schematic representation of an RF-system of the invention.

FIG. 1 shows a schematic representation of an RF-system of the invention. The RF-system comprises the RF-array 10, shown as a flexible array 10 including a large number (e.g. 32×64) antenna elements. The flexible array 10 may be curved or shaped in many different manners so as to e.g. wrap against or around the load 50, e.g. the patient to be examined. The regulating arrangement 20 includes electronic circuitry to adjust the operational settings, for example to tune/match/decouple the antenna elements e.g. by setting capacitances and/or inductances of the individual antenna elements. To that end, the regulating arrangement is coupled to the RF-array by way of a control bus 21. The regulating arrangement functions to adjust the local impedances of the antenna elements, e.g. by adjusting capacitances, e.g. former by pin-diodes or inductances of the antenna elements. Further the regulating arrangement may adjust the mutual impedances between antenna elements and also the coupling of the antenna elements with the load 50.

A camera system 30 is provided to image the RF-array 10 and optionally together with the load 50. The camera system may include a 3D camera, two or more 2D cameras, or provide for a single 2D camera to image the RF-array 10 from different positions and/or orientations. Thus, the camera system generates an image signal that carries the image information that represents a depth-image of the RF-array 10 and preferably also of the load 50. An image processing unit 42 is provided in the analysis module 50. The image processing unit derives the geometric shape of the RF-array 10 from the image signal from the camera system. The image processing unit may also derive local distances between the antenna elements and the load. The geometrical shape is fed to the neural network 41 contained in the analysis module 40. Form the geometrical shape, the neural network derives or recognises operational settings, e.g. resonant tuning settings for the RF-array 10. These resonant tuning are applied to the tuning arrangement 20 to control the adjustment of the impedances of the antenna elements. To that end the regulating arrangement 20 is coupled of a control bus 21 to the RF-array.

The RF-system further includes one or more sensors 11 to measure local distances of the RF-array 10 to the load 50. Also sensors 11 may be provide to measure the local mutual impedance of (some of) the individual antenna elements, local electrical currents in the RF-array, local impedances or local signal transmission strengths. The measured data from the sensors 11 are applied to an arithmetic unit 43 of the analysis module 40. the analysis module computes an impedance distribution of the RF array from the measured data. The impedance distribution is applied to the neural network to derive the operational settings, such as the resonant tuning settings. These resonant tuning settings are applied to the tuning arrangement to control the operational settings of the RF-array.

Figure 2:
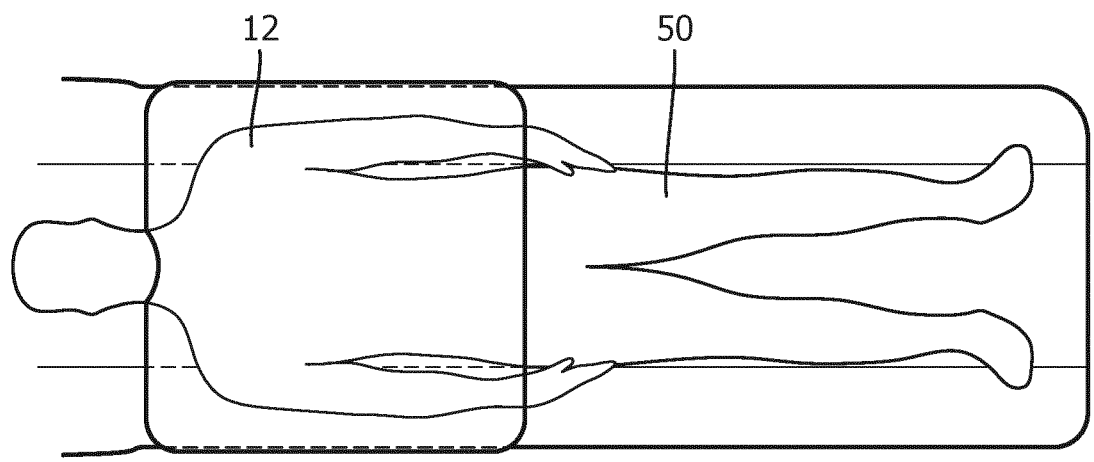
FIG. 2 shows an example of a depth image made by the camera system of the RF-system of the invention and FIG. 3 shows a flow chart representing an example of training the neural network by way of the method of the invention.

FIG. 2 shows an example of a depth image made by the camera system of the RF-system of the invention.

The depth image shows that the load 50 is a patient to be examined in supine position. Also the deformed RF-array 12 is shown as an anterior flexible RF array wrapped over the patient's thorax.

Figure 3:
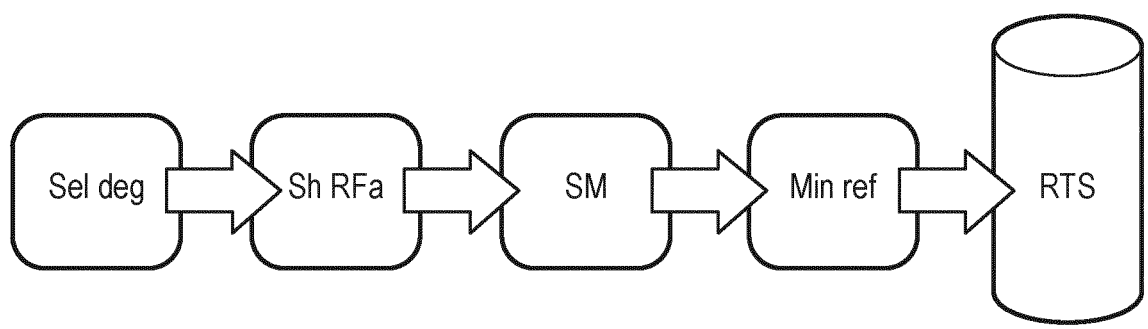

FIG. 3 shows a flow chart representing an example of training the neural network by way of the method of the invention. The training starts form selecting (Sel def) a plausible deformation from a pre-determined collection of clinically plausible deformations. Next, the RF-array is actually shaped (ShRFa) into the selected plausible shape. While in that plausible shape, RF signals are fed to the RF-array and its scattering matrix is measured (SM) by way of a (multi-channel) network analyser. Then, the operational settings, notably the resonant tuning settings of the individual antenna elements of the RF-array are varied while maintaining the RF-array's geometrical shape and such that the reflected RF signal becomes minimal (Min ref). This results in the resonant tuning of the RF-array for the selected plausible shapes. This procedure is iterated for a number of pre-determined plausible shapes. This iteration results in a library that represents the operational settings, such as resonant tuning settings related to a set plausible geometrical shape. Also, operational settings like impedance matching and decoupling settings may be recognised from the actual geometric shape and includes in the library. On the basis of this library the neural network is trained to recognise the proper operational settings such as resonant tuning setting, impedance matching setting and/or (de)couplings for arbitrary actual geometrical shapes of the RF-array.

The invention claimed is:

1. A radio frequency (RF) system comprising:
   an RF-array of antenna elements
   a regulating arrangement to tune at least one impedance associated with at least one antenna element of the RF-array of antenna elements;
   a camera system to acquire image information of the RF-array and
   an analysis module to:
     derive operational settings of the at least one impedance of the RF-array of antenna elements from the image information, wherein
   the analysis module is configured to compute an actual shape of the RF-array from the image information and derive the operational settings of the at least one impedance associated with at least one antenna element of the RF-array of antenna elements in dependence of the computed RF-array's actual geometrical shape.

2. The RF-system as claimed in claim 1, wherein the analysis module includes a trained neural network that is trained to derive the operational settings from the image information or from the computed RF-array's actual geometrical shape.

3. The RF-system as claimed in claim 2 wherein:
the analysis module is configured to receive information on mutual electromagnetic coupling between antenna elements and on electromagnetic coupling between the antenna elements and a load and
the trained neural network is trained to derive additional decoupling settings of the RF-array to compensate for mutual electromagnetic coupling and/or electromagnetic coupling to a load.

4. The RF-system as claimed in claim 1, wherein the camera system includes a depth sensing camera assembly.

5. The RF-system as claimed in claim 1, wherein a contrast enhancement pattern is disposed on the RF-array.

6. The RF-system as claimed in claim 1, wherein the RF-array is a flexible array.

7. The RF-system as claimed in claim 1 wherein the analysis module is provided with a pattern recognition function to recognize sharp shape transitions in the actual shape of the RF-array.

8. A method to train a neural network to associate operational settings of at least one impedance of at least one antenna elements of an RF-array with image information of the RF-array or with a computed actual geometric shape of the RF-array, the method comprising
shaping the RF-array into a plurality of respective geometrical shapes;
for each of the respective geometrical shapes measure a scattering matrix associated with the geometric shape of the RF-array and tune the at least one impedance of the at least RF antenna elements to achieve minimum signal reflection.

9. A method to train the neural network of claim 8, wherein the plurality of respective geometrical shapes is pre-selected to correspond to plausible deformations in clinical use.

10. A method of deriving operational settings of a radio frequency (RF) array of antenna elements comprising:
acquire image information corresponding to an RF-array of antenna elements by a camera;
compute an actual geometrical shape of the RF-array of antenna elements based on the acquired image information; and
derive operational settings of at least one impedance associated with at least one antenna element of the RF-array of antenna elements in dependence of the computed RF-array's actual geometrical shape.

* * * * *